United States Patent [19]

Chao et al.

[11] Patent Number: 5,031,111
[45] Date of Patent: Jul. 9, 1991

[54] AUTOMATED CIRCUIT DESIGN METHOD

[75] Inventors: Chente Chao, Irvine; Michail Y. Itkis, Redondo Beach, both of Calif.

[73] Assignee: TRW Inc., Redondo Beach, Calif.

[21] Appl. No.: 229,948

[22] Filed: Aug. 8, 1988

[51] Int. Cl.$^5$ .............................................. G06F 15/60
[52] U.S. Cl. .................................. 364/491; 364/490; 364/489; 364/488
[58] Field of Search ............... 364/488, 489, 490, 491, 364/300; 307/603

[56] References Cited

U.S. PATENT DOCUMENTS

| | | | |
|---|---|---|---|
| T.935,003 | 6/1975 | Linville et al. | 364/490 |
| T.938,005 | 9/1975 | Colton et al. | 364/490 |
| T.940,015 | 11/1975 | Ho et al. | 364/488 |
| 4,577,276 | 3/1986 | Dunlop et al. | 364/491 |
| 4,593,363 | 6/1986 | Burstein et al. | 364/491 |
| 4,651,284 | 3/1987 | Watanabe et al. | 364/491 |
| 4,700,317 | 10/1987 | Watanabe et al. | 364/488 |
| 4,701,860 | 10/1987 | Mader | 364/488 |
| 4,811,237 | 3/1989 | Putatunda et al. | 364/491 |
| 4,815,003 | 3/1989 | Putatunda et al. | 364/491 |

Primary Examiner—Gary Chin
Assistant Examiner—V. N. Trans
Attorney, Agent, or Firm—Noel F. Heal; Ronald L. Taylor

[57] ABSTRACT

An automated technique for the design of microwave and similar circuits using a knowledge based computer system containing a library of fixed-topology circuits and an associated store of knowledge concerning the performance and limitations of these circuits over a variety of operating conditions. The method of the invention permits a relatively unskilled user to specify a circuit by performance parameters only, and to obtain as an end product a coded output that will drive a conventional mask fabrication system used to produce the circuit. Important features of the invention include its use of a unified data structure in which both physical and electrical characteristics of every circuit element are stored together in the rationally consistent manner to facilitate circuit layout, and its use of a circuit compaction procedure that makes use of the unified data structure and minimizes the circuit area without adversely affecting electrical circuit performance.

8 Claims, 5 Drawing Sheets

FIG. 3.1
NETWORK IMPEDANCE (SIMP)

FIG. 3.2
SHUNT IMPEDANCE (SHIMP)

FIG. 3.3
RIGHT-ELL (RTL)

FIG. 3.4
LEFT-ELL (LTL)

FIG. 3.5
TEE NETWORK (T)

FIG. 3.6
Pi NETWORK (Pi)

FIG. 3.7
LADDER NETWORK (LEFT) (LADL)

FIG. 3.8
LADDER NETWORK (RIGHT) (LADR)

FIG. 3.9
BRIDGED TEE NETWORK (BRT)

FIG. 3.10
BRIDGED Pi NETWORK (BRPi)

FIG. 3.11

TWIN-TEE NETWORK (TWT)

FIG. 3.12

LATTICE NETWORK (LAT)

FIG. 3.13

(i) TRANSMISSION LINE (TL)

$Z_0$

(ii) SHORT CIRCULATED TL (TLSC)

$Z_0$ (iii) OPEN CIRCUITED TL (TLOC)

FET

SPECIAL CASES:
(i) GROUND SOURCE

FET/G (ii) GROUNDED GATE

FET/S

FIG. 3.15

DIODE
(i) SERIES DIODE (SD)

(ii) SHUNT DIODE (SHD)

FIG. 3.16

DUAL-GATE FET

SPECIAL CASE:
(i) GROUNDED SOURCE

AUTOMATED CIRCUIT DESIGN METHOD

BACKGROUND OF THE INVENTION

This invention relates generally to automated monolithic circuit design techniques and, more particularly, to the design of microwave or similar circuits in which physical dimensions and circuit topology have a significant effect on the electrical characteristics and performance parameters of the circuits.

For some types of circuitry, such as relatively low-frequency digital circuitry, the physical topology of a circuit has little, if any, effect on circuit performance and characteristics. At higher frequencies, and especially in microwave circuits, the shape of circuit components, such as transmission lines, and their proximity to each other have a very significant effect on performance. Parasitic impedances between adjacent components, radiation losses from sharply curved transmission lines, and unexpected effects of scaling components in size, all contribute to the difficulty of microwave circuit design.

The process of designing low-frequency digital circuit design has been automated to some degree for a number of years. There, the circuit layout problem is generally a matter of fitting a desired set of circuit components into as small an area as possible and arranging that interconnecting conductive traces are laid out in a manner that minimizes the lengths of the conductive paths. There is usually little concern about conductor spacing, except that there is usually a minimum spacing geometry dictated by the resolution limits of the fabrication process employed. Another aspect of low-frequency design is that a skilled designer can typically predict circuit performance with considerable accuracy from a knowledge of the circuit layout.

By way of contrast, the performance of monolithic microwave circuitry is much more difficult to predict from the circuit layout. Currently, the design of even a simple microwave monolithic circuit requires repeated iterations by an expert circuit designer. Even with the availability of computer software to aid the designer in some areas, the process still depends heavily on the expert designer's ability to make appropriate iterative changes in the design, to translate the output from one design aid program for input to another, and to perform other manual steps in reaching an optimum design, frequently on an intuitive basis.

Typically, the first step in the circuit design process is synthesis, to determine the initial topology and element values of matching components that will be used to perform a desired circuit function. Circuit synthesis computer programs are commercially available, to synthesize various microwave circuits, such as filters and amplifiers. The next step is optimization, in which the values provided in the initial synthesis process are optimized for better performance. Computer programs are also available to perform circuit optimization for various microwave circuits. The final step before fabrication is layout of the circuit. This step relies heavily on the expert designer to come up with a circuit topology that conforms with the synthesized and optimized circuitry, but does not contribute adversely to circuit performance. Multiple iterations of the layout step are almost always required and, although computer simulations of performance are helpful, the final design may not be achieved without several iterations of fabrication and testing of the resulting circuitry. A particularly important aspect of the layout step is circuit compaction. As in all monolithic circuit design, an important goal is to minimize the overall circuit area. In low-frequency design, compaction of the circuit into as small an area as possible is a tedious but relatively simple problem. In microwave circuit design, the problem is far from trivial. For example, a transmission line in a microwave circuit must be of a specified length. The space occupied by the transmission line can be reduced by introducing multiple bends into the line, but this results in at least two related difficulties: radiative losses from bends that are too sharp, and interference, physically or electrically, betweem adjacent components.

Because of the complexity and repetitive nature of the microwave circuit design task, even simple circuits may take a highly skilled designer weeks to complete. Therefore, it will be appreciated that there is a need for an alternative approach that minimizes the involvement of expert designers, and produces completed circuit designs efficiently and rapidly. The present invention satisfies this need.

SUMMARY OF THE INVENTION

The present invention resides in an automated method for designing microwave and millimeter-wave integrated circuitry and the like. Available design tools are automatically integrated and coordinated to achieve a design goal, which is specified solely in terms of performance requirements.

Briefly, and in general terms, the invention comprises the steps of partitioning the circuit into target microcell modules, searching a library of microcell circuit designs for an exact match for each target microcell, and then for each microcell for which no exact match is found in the library, searching a sub-library of universal structured integrated circuit microcells, each of which has a fixed topology and an associated store of knowledge based data concerning the circuit's range of operation and limitations. Upon finding an appropriate match in the sub-library, the method includes the steps of synthesizing the target microcell using knowledge based data associated with the matching universal structured integrated circuit microcell, optimizing the target microcell, producing a layout of the target microcell, compacting the target microcell to as small an area as possible without adversely affecting the electrical characteristics of the microcell, simulating the target microcell to determine the effect of parasitic impedances, based on the knowledge based data associated with the universal structured integrated circuit microcell, and finally generating a coded output data stream in a suitable format to drive a conventional mask pattern generation machine.

In accordance with another aspect of the invention, data items relating to the various primitive circuit elements, circuit microcells and circuit macrocells are stored in a unified data structure or format. In particular, the data structure defines each circuit element, at any level of complexity, in terms of both its electrical and its physical characteristics. In terms of a novel method, this aspect of the invention includes the steps of partitioning a circuit into macrocells, partitioning the macrocells into microcells, partitioning the microcells into smaller microcells and primitive circuit elements, and storing for each macrocell, microcell and primitive circuit element, data in a unified format defining electrical characteristics and interconnections, and physical characteristics and locations of the circuit modules, to form a complete hierarchical definition of the entire circuit. By use of this unified data structure, circuit layout is greatly facilitated because the electrical and physical characteristics are stored together in the unified structure.

Another important aspect of the invention is that a designed circuit may be automatically compacted to occupy as small an area as possible without adversely affecting the electrical characteristics of the circuit. The compaction method in general comprises the steps of considering each transmission line in turn, initially setting a count of U-shaped bends in the transmission line to one, determining whether the line as bent in accordance with the count still has sufficient length to meet its electrical requirements, and whether the line as bent will produce undesirable coupling between lines, and, depending on the results of the determining step, increasing the number of bends in the transmission line and repeating the determining step until such time as the determining step indicates that further compaction of the line is not possible. The final steps after determining that further compaction is not possible are checking boundary conditions to ensure that the transmission line as bent is not unduly interfering with adjacent components, and then terminating the compaction process.

Additional steps in the compaction process, performed initially, are checking the aspect ratio, of length to width, of the transmission line, and if the aspect ratio is below a preselected threshold value, terminating the compaction process.

More specifically, the determining step includes calculating the minimum line length with the current number of bends, using a predetermined bend radius, comparing the calculated minimum length with the electrically required line length, and comparing the distance between bends of the line and the distances between the line and other components, with predetermined minimum clearances to avoid undesirable coupling.

It will be appreciated from the foregoing that the present invention represents a significant advance in the field of design and fabrication of integrated circuits for operation at high frequencies, such as microwave circuits and millimeter-wave circuits. In particular, the invention provides a novel automated approach to the design of such circuits, using a knowledge based system to design circuits quickly based on user-supplied specifications. Other important aspects of the invention are its use of a unified data structure containing both the electrical and the physical characteristics of circuit elements in a single structure, to facilitate layout and other operations of the system, and its use of a circuit compaction technique to reduce the area occupied by the circuit without detracting from its electrical performance. Other aspects and advantages of the invention will become apparent from the following more detailed description, taken in conjunction with the accompanying drawings.

BRIEF DESCRIPTION OF THE DRAWINGS

FIGS. 2.1–2.4 are schematic diagrams showing four examples of low-noise microwave amplifier topologies, referred to as MUSIC members;

FIGS. 3.1–3.16 are schematic diagrams of simple microwave network microcells and primitive circuit elements used in forming microcell circuits in accordance with the invention;

DESCRIPTION OF THE PREFERRED EMBODIMENT

As shown in the drawings for purposes of illustration, the present invention is concerned with an automated system for designing integrated circuitry that operates at very high frequencies, such as microwave frequencies. The principal difficulty in designing microwave integrated circuitry is that the electrical characteristics of a microwave circuit are closely related to its physical characteristics. For example, if a microwave transmission line is made curved instead of straight, to fit into a desired area, the electrical characteristics of the line may be affected by factors including the radius of curvature and the proximity of the line to other components. The design of microwave circuitry has, prior to this invention, evolved into an iterative and intuitive process requiring many days or weeks of effort by highly skilled personnel to complete even relatively simple designs.

In accordance with an important aspect of the invention, the process of designing a microwave or similar integrated circuit is automatically controlled by computer software such that only the performance characteristics of a desired circuit need be specified by a design engineer. Available computer-based design tools are utilized, and are integrated into a complete design system.

Definitions

As in many computer-based technologies, acronyms have been developed to describe in shorthand form various components and features. Many of these are used throughout the specification, for brevity of description.

"MIMIC" means MIcrowave Monolithic Integrated Circuit.

"MUSIC" means Microwave Universal Structured Integrated Circuit.

"CAD" means Computer Aided Design.

"MMW" means MilliMeter Wave.

A "MUSIC member" is a circuit with a fixed topology, of which the range and limitation of operation have been extensively studied and programmed by an expert designer for future use.

"MUSIC methodology" is the process by which MIMIC designs are reduced to a finite number of manageable topologies (MUSIC members) and then to computer software form, which can be utilized by designers to facilitate the generation of MIMIC circuits to meet complex requirements.

"Macrocell," "microcell" and "primitive" are terms used to define circuit modules in a hierarchical structure. Primitives are circuit elements that make up microcells and macrocells. They include resistors, capacitors, inductors and transistors. Microcells are interconnected sets of primitives designed to perform specific functions. They include amplifiers, mixers, switches, and so forth. The term macrocell generally refers to an entire circuit or a chip-level architecture, containing multiple microcells and primitives. The number of hierarchical levels of cell structure will depend on the nature and complexity of the circuitry.

"Data structure" is a term referring to the structure of a hierarchical database in which both the physical and electrical characteristics of primitives, microcells, macrocells and music members are stored.

Overview of Design Approach

Figure 1:
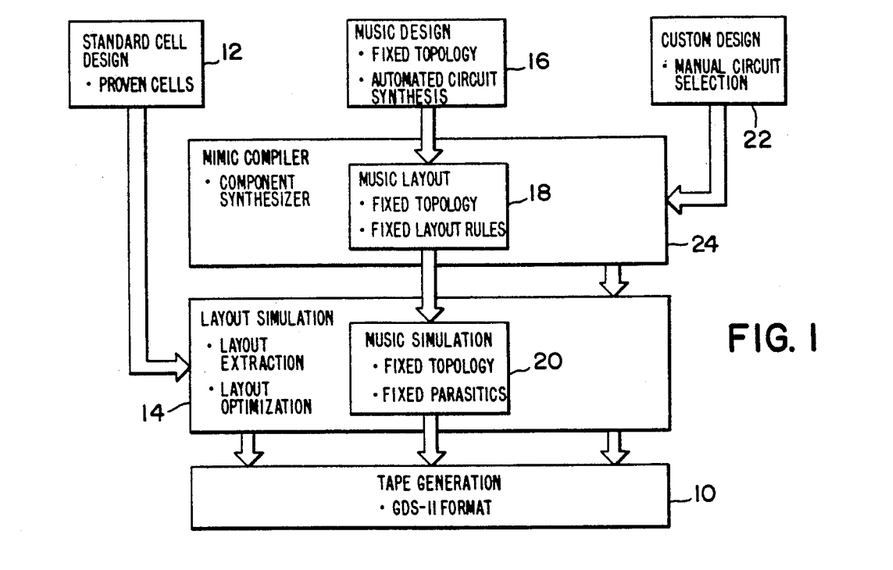
FIG. 1 is a simplified block diagram showing the design approach of the invention.

FIG. 1 shows in simplified diagrammatic form how the design approach of the invention provides a user three integrated approaches to designing a circuit macrocell. The ultimate goal of each approach is to produce a coded tape, as indicated at reference numeral 10, which may be used to generate fabrication masks in a commercially available integrated circuit fabrication system.

The system of the invention as presently developed automates circuit design at the microcell level, as this term is defined in the foregoing section. Once multiple microcells have been designed, it is a relatively straightforward procedure to combine them into a single macrocell in one integrated circuit. In fact the techniques set forth in this specification for microcell design are equally applicable to macrocell design.

The first and simplest approach is for the user to search, at a workstation (not shown), through a library of standard macrocells for one matching the user's requirements exactly, as indicated generally in block 12. If a match is found, the user can proceed with steps of layout simulation and layout optimization for each microcell of the structure, as indicated in block 14, prior to tape generation (block 10). The user can utilize an available program to partition the desired macrocell into microcells, for which library searches can be made to locate a match between the user's needs and items in the library of proven microcells.

If an individual microcell cannot be matched in the cell library, the user then follows the MUSIC design approach, indicated by blocks 16, 18 and 20. In the step described generally as MUSIC design (block 16), the system searches for a MUSIC member that meets the designer's needs. This is a fixed-topology circuit cell for which the performance and limitations have been extensively studied by an expert designer. The music member is, in effect, a design template that completely defines the topology and interconnections of elements making up the member, but for which physical and electrical parameters are to be defined as the process proceeds.

The next step, also contained in block 16, is that of circuit synthesis. This automatically selects initial values for the circuit parameters of the MUSIC member, based on performance characteristics supplied by the user, and an optimization program is used to further refine these parameters. Next, in block 18, a layout is generated for the optimized circuit. Using the fixed topology of the MUSIC member microcell, and fixed layout rules, a symbolic representation of the layout is generated, and then the layout is compacted by reducing the areas occupied by transmission lines within the microcircuit, while maintaining the electrical characteristics of the microcell.

In block 20, the system performs a simulation of the resulting microcell, using fixed values of parasitic impedances. Although it is not apparent from FIG. 1, the MUSIC design approach is an iterative one at several levels. Some of the steps, such as optimization and compaction, are internally iterative and may need multiple passes for completion. Also the overall system is iterative in the sense that multiple passes may be made until design and cost goals are satisfactorily met.

In the final step of tape generation (10), the symbolic representation of the layout is translated into an actual layout by driving a commercial layout editor program. Layout algorithms used in this step utilize tables of design rules that are specific to the ultimate manufacturing process to be used. At this final stage, the layout may be edited and modified by the user by adding standard test structures and any required logos or markings.

The third alternative approach to circuit design shown in FIG. is custom design, which need only be used if the proposed design has a microcell that cannot be found in the sub-library of MUSIC members. The custom design feature, indicated in block 22, allows the user to design a microcell using cost, yield and performance data provided by the system. Then a MIMIC compiler 24 performs component synthesis for the microcell. The layout and simulation steps 14 are the same as for a standard cell.

Music Topology Examples

In an initial implementation of the invention, for the design of microwave integrated circuits, a total of twenty-five MUSIC members were stored in a cell library. These included nineteen amplifiers, three mixers, one switch, one phase shifter and one variable attenuator. Current studies indicate that all microwave circuits can be implemented with a total of fifty-four MUSIC topologies, and that twenty-six of these can take care of about eighty percent of all microwave applications.

FIGS. 2.1–2.4 are examples of MUSIC member topologies. All are low-noise amplifiers, and the FIG. 2.4 topology is for a three-stage amplifier. Each of the blocks in these figures identifies a lower-level circuit network by mnemonic or abbreviation. These mnemonics are defined in FIGS. 3.1–3.16, and are listed below for convenience:

| | | |
|---|---|---|
| FIG. 3.1 | Network (series) impedance | SIMP |
| FIG. 3.2 | Shunt impedance | SHIMP |
| FIG. 3.3 | Right-ell | RTL |
| FIG. 3.4 | Left-ell | LTL |
| FIG. 3.5 | Tee network | T |
| FIG. 3.6 | Pi network | PI |
| FIG. 3.7 | Ladder network (left) | LADL |
| FIG. 3.8 | Ladder network (right) | LADR |
| FIG. 3.9 | Bridged tee network | BRT |
| FIG. 3.10 | Bridged Pi network | BRPI |
| FIG. 3.11 | Twin tee network | TWT |
| FIG. 3.12 | Lattice network | LAT |
| FIG. 3.13 | Transmission lines | |
| FIG. 3.13 | (i) Transmission line | TL |
| FIG. 3.13 | (ii) Short circuited line | TL |
| FIG. 3.13 | (iii) Open circuited line | TLOC |
| FIG. 3.14 | Field-effect transistor | FET |
| FIG. 3.14 | (i) FET, grounded source | FET/S |
| FIG. 3.14 | (ii) FET, grounded gate | FET/G |
| FIG. 3.15 | Diode | |
| FIG. 3.15 | (i) Series diode | SD |
| FIG. 3.15 | (ii) Shunt diode | SHD |
| FIG. 3.16 | Dual-gate FET | DGFET |
| FIG. 3.16 | (i) DGFET, grounded source | DGFET/S |

It will be noted that, for example, each stage of the three-stage amplifier in FIG. 2.4 consists of a right-ell (RTL) 40 at its input, which is connected to the gate terminal of a field-effect transistor FET 42. A series impedance (SIMP) 44 is connected to the source terminal of the FET 42, and a simple transmission line T (46) is connected to the drain terminal of the FET. The other microwave topologies are implemented in the same manner, as combinations of the elemental networks of FIGS. 3.1–3.16.

Music Design Process

Figure 4:
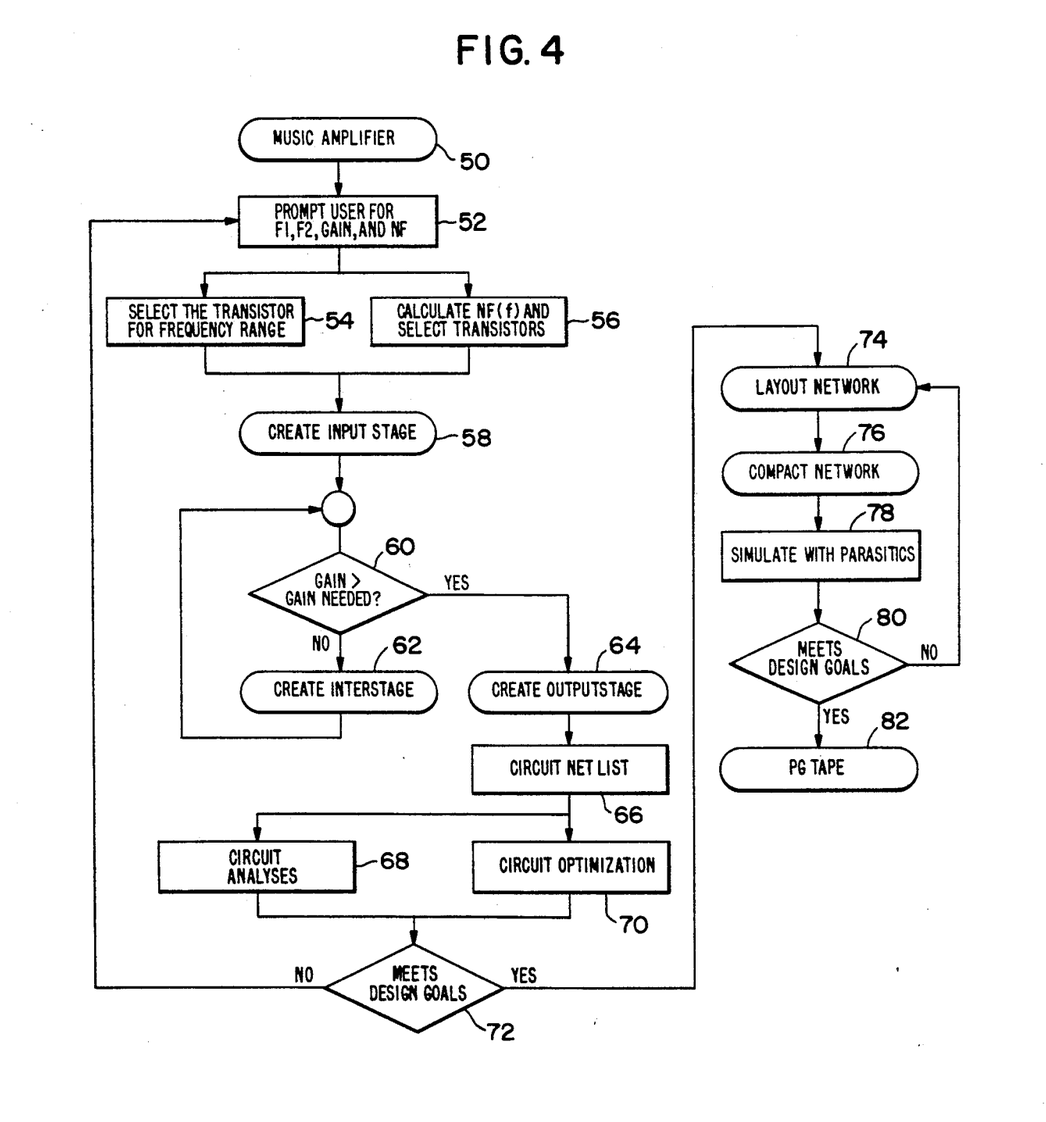
FIG. 4 is a simplified flowchart showing the steps followed in designing a circuit microcell in accordance with the invention.

Once a MUSIC member has been selected to form a microcell, the circuit parameters have to be selected and optimized to fit the user's needs. The MUSIC member provides a fixed topology and the accumulated expert knowledge of how to apply that topology to meet design specifications. As shown in FIG. 4, it has been determined that the microcell being designed fits within a performance window defined by a MUSIC member defining a three-stage amplifier. As indicated at the start 50, the ensuing steps are for a MUSIC amplifier. In the first block 52 the program prompts the user for the design parameters of the amplifier. Then, in blocks 54 and 56, the transistors are selected for the designated frequency range of the amplifier. Next, in block 58, the input stage of the amplifier is synthesized. In decision block 60, the overall gain is compared with the specified gain needed. If the overall gain is less than that needed, a path is taken to block 62, which creates the middle or interstage of the amplifier to provide additional gain. If the gain meets requirements, control passes to block 64, which synthesizes the output stage of the amplifier. In block 66, a circuit network list is generated and in blocks 68 and 70 circuit analysis and optimization are performed. Finally, in decision block 72, the question is asked whether the system meets the design goals. If the answer is in the negative, control is transferred back to block 52 to perform another iteration of the process and to further refine the design based on modified performance characteristics provided by the user. If the system meets design goals, the next step is to produce a layout of the designed circuit.

In block 74, a preliminary layout of the amplifier is generated, and in block 76 the layout is compacted by reducing the areas of the transmission lines in the circuit. In block 78, a circuit simulation is performed using fixed values of parasitic impedances. Then, in decision block 80, it is determined whether the amplifier meets design goals. If not, return is made to block 74 to perform the layout steps over again. If the design goals are met, the final step, shown at 82, is the generation of a coded tape to be used in mask generation for fabrication of the circuit.

Circuit Compaction

An important aspect of the invention is the manner in which a circuit microcell can be compacted in size to occupy as small an area as possible in an integrated circuit. The compaction process also has to minimize the parasitic impedances of the circuit. Although this process is outwardly similar in some respects to compaction of digital circuitry, there is one fundamental difference. In the compaction of low-speed digital circuitry, the circuits can be made smaller and smaller until some basic processing rule is violated, such as the occurrence of metal-to-metal contact. In the compaction of microwave circuitry, the electrical behavior of the components must also be taken into account.

Figure 5:
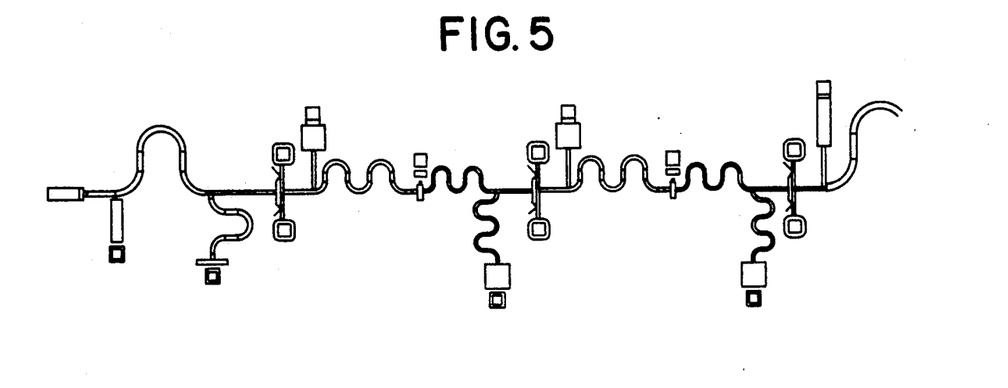
FIG. 5 is a simplified plan view of a three-stage amplifier after compaction in accordance with the invention.

The basic technique in microwave circuit compaction is to reduce the area occupied by transmission lines, by introducing one or more bends in the line. FIG. 5 shows a three-stage amplifier after compaction, with its transmission lines "snaked" to include one or more bends. Each bend includes two 90-degree curves and one 180-degree curve. The design goal is to reduce the area occupied by the transmission line, by introducing as many bends as possible without producing unwanted coupling between elements of the same line, or between the reduced-area line and adjacent components.

The compaction procedure first sets up a set of simultaneous equations which describe the constraints of the layout problem. For example, in compacting a pi network having three interconnected transmission lines the degree of compaction of one transmission line must be weighed against the coupling created within the transmission line and the area required for the other two transmission lines.

Figure 6:
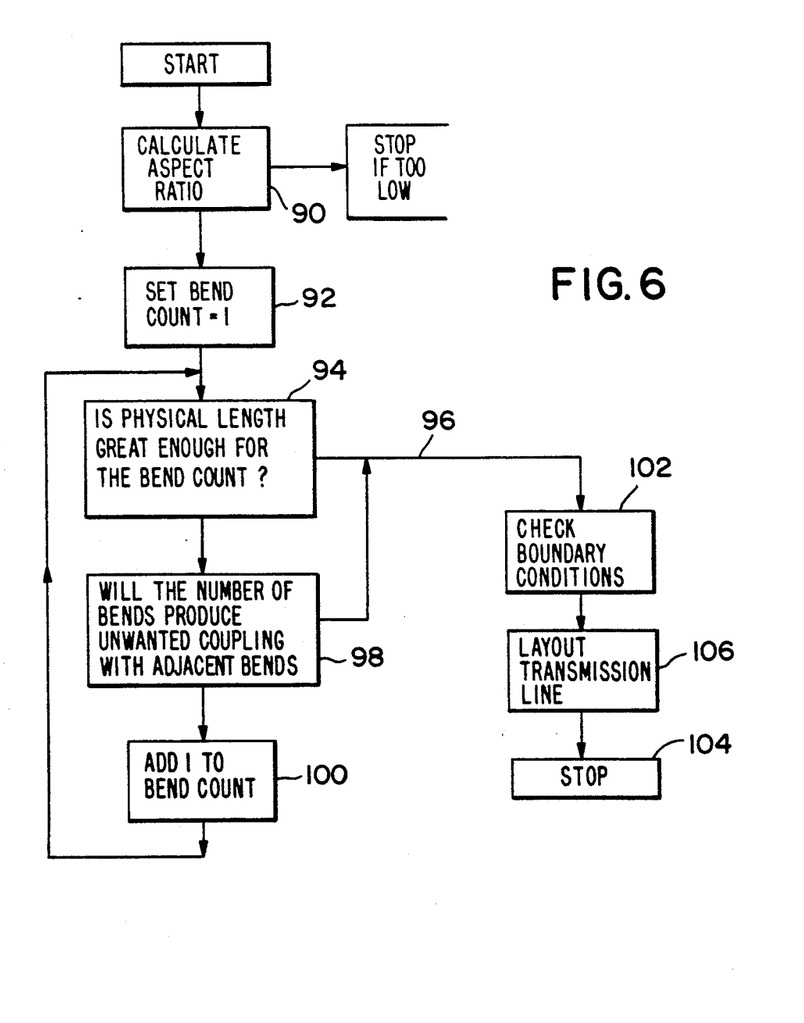
FIG. 6 is a simplified flowchart showing the steps followed in performing circuit compaction in accordance with the invention.
Figure 21:
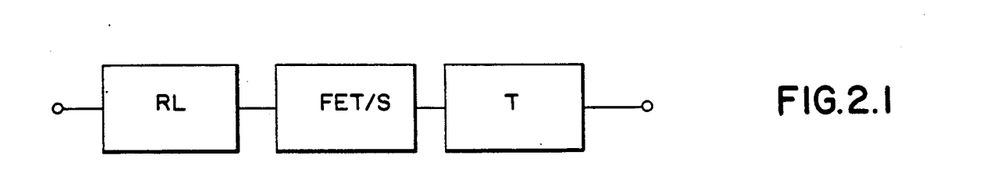
Figure 22:
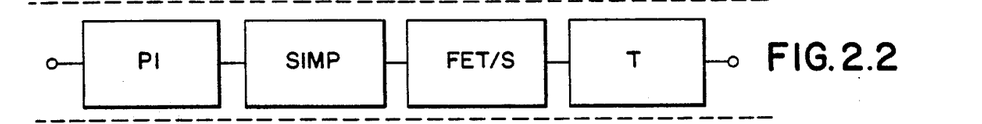
Figure 23:
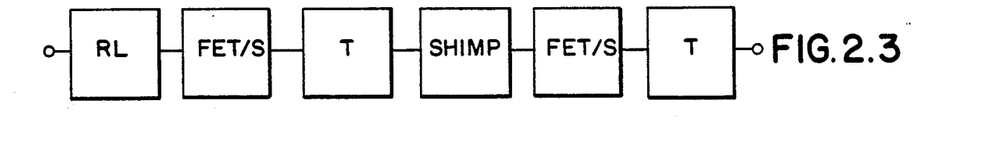
Figure 24:
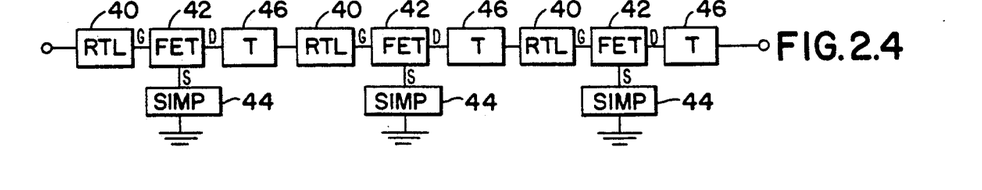
Figure 31:
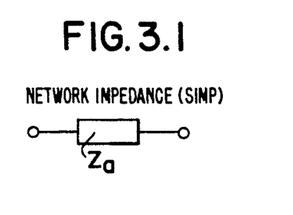
Figure 32:
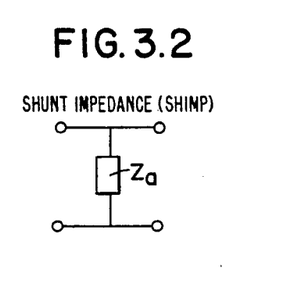
Figure 33:
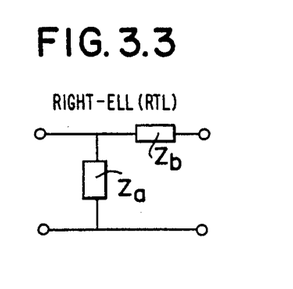
Figure 34:
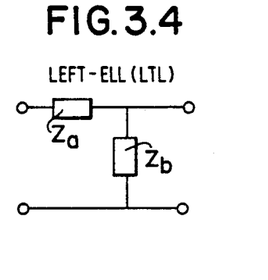
Figure 35:
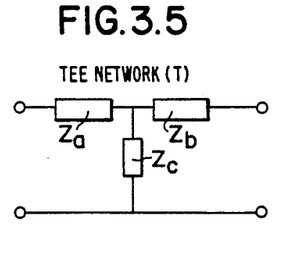
Figure 36:
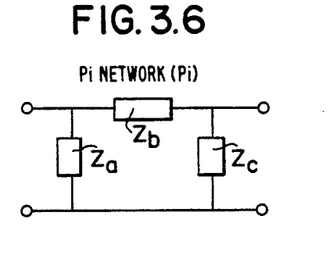
Figure 37:
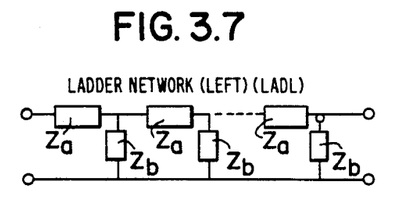
Figure 38:
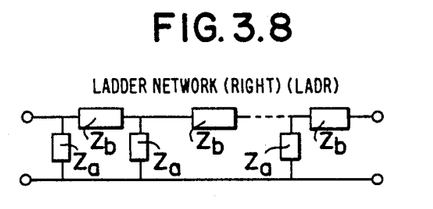
Figure 39:
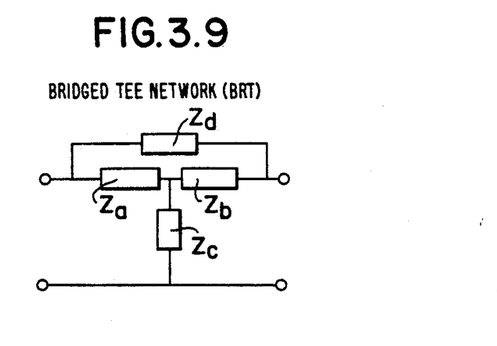
Figure 310:
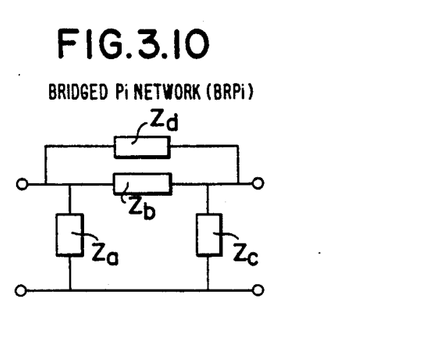
Figure 311:
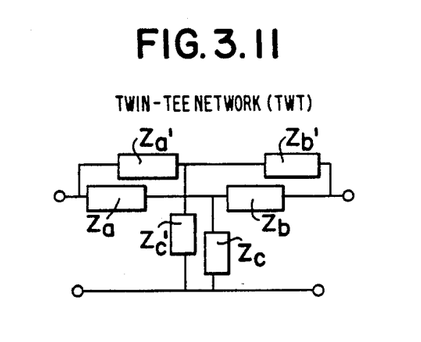
Figure 312:
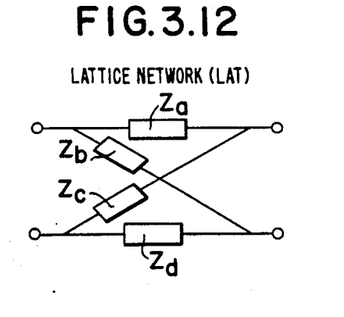
Figure 313:
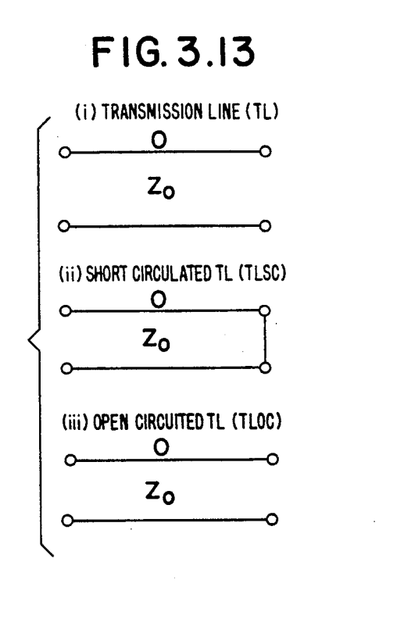
Figure 314:
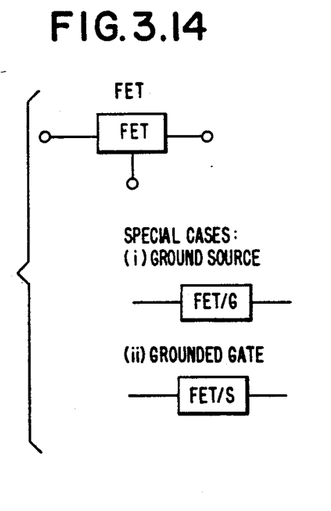
Figure 315:
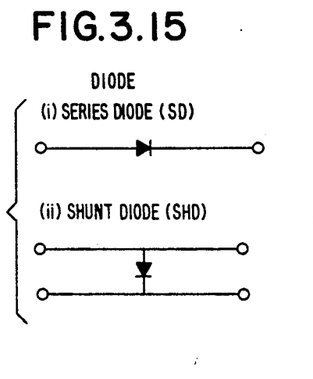
Figure 316:
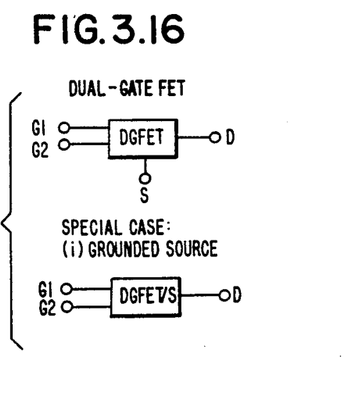

The compaction procedure is shown in simplified form in the flowchart of FIG. 6. After the procedure is started, to compact a particular transmission line, the aspect ratio of the line is first calculated, as indicated in block 90. This is the length-to-width ratio, which, if too low, results in compaction being abandoned before its start. In block 92, the number of bends is first set to one. Then a compaction loop is entered, beginning at block 94, which asks whether the physical length of the line is sufficient to make the number of bends indicated. If there is insufficient line length to make the designated number of bends, an exit path is taken, as indicated at 96. If there is sufficient physical length available, the next question asked, in block 98, is whether the designated number of bends will produce undesirable coupling between adjacent lines in the circuit. If so, the number of bends is increased by one, in block 100, and return is made to block 94 to determine whether the path length is still adequate for the newly proposed number of bends.

When exit is made from the compaction loop at 96, various boundary condition are checked, in block 102, to confirm that the line has not encroached on a neighboring area tentatively set aside for another component. Then the compaction procedure is stopped (at 104) and the newly compacted transmission line is laid out (block 106).

MUSIC Data Structure

An important aspect of the invention is that the data for each hierarchical circuit element are arranged and stored in a consistent manner to include all of electrical and physical characteristics of the element. Probably the best way to explain this concept is by way of example. The following table shows the contents of a data structure entry defining a transmission line:

TABLE 1

| Field | Example | Comments |
| --- | --- | --- |
| TYPE | TRL | Transmission line |
| IPARM1 | 10 | Width in microns |
| IPARM2 | 450 | Length in microns |
| NODES | 2 | Number of nodes or terminals |
| NODE1 | 1 | Number of first node |
| NODE2 | 2 | Number of second node |
| END[0]X | 2028.625 | x ordinate of one end of line |
| END[0]Y | 2020.500 | y ordinate of one end of line |
| END[2]X | 2026.825 | x ordinate of other end of line |
| END[2]Y | 1700.500 | y ordinate of other end of line |
| OBJNUM | 10 | Object number |
| NEXT01P | 9 | Object connected to node 1 |

TABLE 1-continued

| Field | Example | Comments |
| --- | --- | --- |
| NEXT02P | 11 | Object connected to node 2 |
| NEXT03P | 0 | Object connected to node 3 |
| NEXT04P | 0 | Object connected to node 4 |
| NAME1 | WO1 | Pointer to width |
| NAME2 | LO1 | Pointer to length |
| NAME | TRL10 | Object name |

The node numbers, "next" conection information, and object numbers, provide information concerning the electrical interconnections of the transmission line, or other circuit element. The width and length, and the x and y coordinates provide important information about the physical location and size of the transmission line. Because these are all stored in one unified data structure, circuit compaction and the solution of layout problems are facilitated.

Application to Millimeter Wave and HEMT Technology

The circuit components are defined in the unified data structure in a manner that is not dependent on the technology involved. Therefore, the data structure, and indeed the MUSIC approach to design, are equally applicable to other technologies. As a practical matter, however, it makes sense to apply the invention only to technologies and devices that operate at high enough frequencies to justify storing the component descriptions in a unified way, i.e. to devices in which the physical and electrical characteristics are closely interrelated.

The MUSIC design approach has been applied successfully to a three-stage HEMT (high electron mobility transistor) amplifier operating at 44 GHz (gigahertz).

Conclusion

The present invention represents a significant advance in the field of automated circuit design. The design time for microwave circuits can be reduced from periods of days or weeks to as little as a few hours. Moreover, the level of user skill is also reduced, since the system can be used by an engineer or technician with no detailed knowledge of the design of microwave integrated circuits. Aspects of the invention that provide this improvement include the unified data structure for storing circuit element data to include both physical and electrical characteristics, and the circuit compaction technique for minimizing the occupied area of the designed circuit. It will also be appreciated that, although an embodiment of the invention has been described in detail for purposes of illustration, various modifications may be made without departing from the spirit and scope of the invention. Accordingly, the invention is not to be limited except as by the appended claims.

Reference to Program Code

The program code (354 pages) has been submitted as appended material but has been printed as part of the specification. Note that these pages will be retained in the patent file. The program code, which is written in C language, includes the unified data structure, the circuit compaction procedures, and all of the code necessary to perform the design features described above. The program code makes use of the following commercially available packages, for which program listings have not been included:

1. LIBRA, for circuit simulation and optimization, available from EEsof, Inc., 5795 Lindero Canyon Road, Westlake Village, Calif. 91362.

2. CAECO Schematic, for circuit layout, available from CAECO, 2945 Oakmead Village Court, Santa Clara, Calif. 95051.

We claim:

1. For use in a system for automatically fabricating integrated circuits for operation at high frequencies, a method for storing and retrieving data relating to circuit modules, comprising the steps of:

partitioning a circuit into macrocells;

partitioning the macrocells into microcells;

partitioning the microcells into smaller microcells and primitive circuit elements;

storing for each macrocell, microcell and primitive circuit element, data in a universal format defining electrical characteristics and interconnections, and physical characteristics and locations of the circuit modules, to form a complete hierarchical definition of the entire circuit, whereby circuit layout is facilitated because the electrical and physical characteristics are stored together in a unified data structure.

2. A method for automatically designing an integrated circuit for operation at high frequencies, the method comprising:

partitioning the circuit into target microcell modules;

searching a library of microcell circuit designs for an exact match for each target microcell;

for each microcell for which no exact match is found in the library, searching a sub-library of universal structured integrated circuit micorcells, each of which has a fixed topology and an associated store of knowledge based data concerning the circuit's range of operation and limitations;

upon finding an appropriate match in the sub-library. synthesizing the target microcell using the knowledge based upon associated with the matching universal structured integrated circuit microcell;

optimizing the target microcell;

producing a layout of the target microcell;

compacting the target microcell to as small an area as possible without adversely affecting the electrical characteristics of the microcell;

simulating the target microcell to determine the effect of parasitic impedances, based on the knowledge based data associated with the universal structured integrated circuit microcell; and generating a coded output data stream in a suitable format to drive a conventional mask pattern generation machine.

3. A method as defined in claim 2, wherein the step of compacting includes:

considering each transmission line in the circuit in turn;

initially setting a count of U-shaped bends in the transmission line to one;

determining whether the line as bent in accordance with the current count still has sufficient length to meet its electrical requirements, and whether the line as bent will produce undesirable coupling between lines;

depending on the results of the determining step, increasing the number of bends in the transmission line and repeating the determining step until such time as the determining step indicates that further compaction of the line is not possible;

checking boundary conditions to ensure that the transmission line as bent is not unduly interfering with adjacent components; and terminating the compaction process.

4. A method as defined in claim 2, wherein the method further comprises the following preliminary steps to form a unified data structure:

partitioning the microcells stored in the library into smaller microcells and primitive circuit elements;

storing for each microcell and primitive circuit element, data in a unified format defining electrical characteristics and interconnections, and physical characteristics and locations of the circuit modules, to form a complete hierarchical definition of the entire circuit, whereby circuit layout is facilitated because the electrical and physical characteristics are stored together in a unified data structure.

5. A method as defined in claim 3, wherein the method further comprising the following preliminary steps to form a unified data structure:

partitioning the microcells stored in the library into smaller microcells and primitive circuit elements;

storing for each microcell and primitive circuit element, data in a universal format defining electrical characteristics and interconnections, and physical characteristics and locations of the circuit modules, to form a complete hierarchical definition of the entire circuit, whereby circuit layout is facilitated because the electrical and physical characteristics are stored together in a unified data structure.

6. A method for automatically compacting an integrated circuit having high-frequency transmission lines and intended for operation at frequencies up to millimeter-wave range, the method comprising:

considering each transmission line in turn;

initially setting a count of U-shaped bends in the transmission line to one;

determining whether the line as bent in accordance with the current bend count still has sufficient length to meet its electrical requirements, and whether the line as bent will produce undesirable coupling between lines;

depending on the results of the determining step, increasing the number of bends in the transmission line and repeating the determining step will such time as the determining step indicates that further compaction of the line is not possible;

checking boundary conditions to ensure that the transmission line as bent is not unduly interfering with adjacent components; and terminating the compaction process.

7. A method as defined in claim 6, and further comprising the initial step of:

checking the aspect ratio, of length to width, of the transmission line; and if the aspect ratio is below a preselected threshold value, terminating the compaction process.

8. A method as defined in claim 6, wherein the determining step includes:

calculating the minimum line length with the current number of bends, using a predetermined bend radius; comparing the minimum length calculated in the prior step with the electrically required line length; and examining the distance between bends of the line and the distances between the line and other components, with predetermined minimum clearances to avoid undesirable coupling.

* * * * *

(12) REEXAMINATION CERTIFICATE (4297th)

United States Patent
Chao et al.

(10) Number: US 5,031,111 C1
(45) Certificate Issued: Mar. 27, 2001

(54) AUTOMATED CIRCUIT DESIGN METHOD

(75) Inventors: Chente Chao, Irvine; Michail Y. Itkis, Redondo Beach, both of CA (US)

(73) Assignee: TRW Inc., Redondo Beach, CA (US)

Reexamination Request:
No. 90/005,137, Oct. 2, 1998

Reexamination Certificate for:
Patent No.: 5,031,111
Issued: Jul. 9, 1991
Appl. No.: 07/229,948
Filed: Aug. 8, 1988

(51) Int. Cl.⁷ .................................................. G06F 17/50
(52) U.S. Cl. .......................... 716/7; 716/2; 716/5; 716/9; 716/10
(58) Field of Search .................. 364/491; 395/500.04, 395/500.06, 500.1, 500.11; 716/2, 5, 9, 10

(56) References Cited

U.S. PATENT DOCUMENTS

| | | | |
|---|---|---|---|
| T940,015 | * 11/1975 | Ho et al. | 364/488 |
| 3,568,205 | * 3/1971 | Buxton et al. | 343/749 |
| 3,681,782 | * 8/1972 | Scanlon | 364/167.02 |
| 3,971,032 | * 7/1976 | Munson et al. | 343/770 |
| 4,060,820 | * 11/1977 | Pucel et al. | 257/482 |
| 4,160,262 | * 7/1979 | Kovac | 257/215 |
| 4,210,885 | * 7/1980 | Ho | 333/238 |
| 4,217,468 | * 8/1980 | Rice et al. | 178/116 |
| 4,254,445 | * 3/1981 | Ho | 361/728 |
| 4,259,684 | * 3/1981 | Dean et al. | 257/664 |
| 4,291,311 | * 9/1981 | Kaloi | 343/700 |
| 4,328,530 | * 5/1982 | Bajorek et al. | 361/762 |
| 4,331,940 | * 5/1982 | Uwano | 331/99 |
| 4,411,022 | * 10/1983 | Clifton et al. | 455/327 |
| 4,429,290 | * 1/1984 | Devan | 333/241 |
| 4,431,965 | * 2/1984 | Aslan | 324/95 |
| 4,441,088 | * 4/1984 | Anderson | 333/1 |

(List continued on next page.)

OTHER PUBLICATIONS

Litigation Review for U.S. Pat. No. 5,031,111, May 2000.*
Pucel; "Design Considerations for Monolithic Microwave Circuits; IEEE Transactions on Microwave Theory and Techniques," vol. MTT–29, No. 6, pp. 513–534, Jun. 1981.*
Bahl et al., text entitled "Microwave Solid State Circuit Design," Wiley & Sons, Inc., New York; Chapters 2, 14 & 15, Apr. 1988.*
Yamashita et al.; Characterization Method and Simple Design Formulas of MCS Lines Proposed for MMIC's; IEEE Transactions on Microwave Theory and Technique; vol. MTT–35, No. 12, pp. 1355–1362, Dec. 1987.*
Jansen et al.; "A Comprehensive CAD Approach to the Design of MMIC's up to MM–Wave Frequencies"; IEEE Transactions on Microwave Theory and Techniques; vol. MTT–36, No. 2; pp. 208–219, Feb. 1988.*
Pettenpaul et al.; "CAD Models of Lumped Elements on GaAs up to 18 GHz"; IEEE Transactions on Mircowave Theory and Techniques; vol. MTT–36, No. 2; pp. 294–304, Feb. 1988.*

(List continued on next page.)

Primary Examiner—Kevin J. Teska (57) ABSTRACT

An automated techique for the design of microwave and similar circuits using a knowledge based computer system containing a library of fixed-topology circuits and an associated store of knowledge concerning the performance and limitations of these circuits over a variety of operating conditions. The method of the invention permits a relatively unskilled user to specify a circuit by performance parameters only, and to obtain as an end product a coded output that will drive a conventional mask fabrication system used to produce the circuit. Important features of the invention include its use of a unified data structure in which both physical and electrical characteristics of every circuit element are stored together in the rationally consistent manner to facilitate circuit layout, and its use of a circuit compaction procedure that makes use of the unified data structure and minimizes the circuit area without adversely affecting electrical circuit performance.

U.S. PATENT DOCUMENTS

| | | | |
|---|---|---|---|
| 4,450,419 | * | 5/1984 | Schwarzmann .................... 333/164 |
| 4,481,628 | * | 11/1984 | Pasquinelli ........................ 714/745 |
| 4,489,364 | * | 12/1984 | Chance et al. ..................... 361/737 |
| 4,495,559 | * | 1/1985 | Gelatt et al. ................ 364/148.01 |
| 4,498,122 | * | 2/1985 | Rainal .............................. 361/794 |
| 4,499,441 | * | 2/1985 | Lynch et al. ...................... 333/161 |
| 4,516,071 | * | 5/1985 | Buehler ............................. 324/765 |
| 4,525,720 | * | 6/1985 | Corzine et al. ................... 343/895 |
| 4,546,357 | * | 10/1985 | Laughon et al. .................. 342/371 |
| 4,593,243 | * | 6/1986 | Lao et al. ......................... 324/754 |
| 4,595,881 | * | 6/1986 | Kennan ............................... 330/54 |
| 4,599,585 | * | 7/1986 | Vorhaus et al. ................... 333/164 |
| 4,612,618 | * | 9/1986 | Pryor et al. .................. 395/500.11 |
| 4,613,940 | | 9/1986 | Shenton et al. . |
| 4,614,915 | * | 9/1986 | Heston et al. .................... 330/257 |
| 4,635,062 | * | 1/1987 | Bierig et al. ..................... 342/372 |
| 4,641,140 | * | 2/1987 | Heckaman et al. ............... 342/371 |
| 4,651,284 | * | 3/1987 | Watanabe et al. ........... 395/500.09 |
| 4,660,006 | * | 4/1987 | Tajima et al. .................... 333/218 |
| 4,662,000 | * | 4/1987 | Tajima et al. .................... 455/333 |
| 4,670,770 | * | 6/1987 | Tai ................................... 257/777 |
| 4,673,958 | * | 6/1987 | Bayraktaroglu ................... 331/107 |
| 4,695,810 | * | 9/1987 | Heckaman et al. .................... 333/1 |
| 4,706,020 | * | 11/1987 | Viertl et al. ...................... 324/238 |
| 4,720,690 | * | 1/1988 | Popek et al. ......................... 333/1 |
| 4,724,427 | * | 2/1988 | Carroll .......................... 340/572.1 |
| 4,734,751 | * | 3/1988 | Hwang et al. .................... 257/259 |
| 4,737,236 | * | 4/1988 | Perko et al. ........................ 216/13 |
| 4,739,334 | * | 4/1988 | Soref ................................ 342/368 |
| 4,742,355 | * | 5/1988 | Wolfson et al. .................. 342/375 |
| 4,754,243 | * | 6/1988 | Armstrong et al. ............... 333/250 |
| 4,763,085 | * | 8/1988 | Lamberg ............................ 331/56 |
| 4,771,247 | * | 9/1988 | Jacomb-Hood ................... 330/277 |
| 4,797,787 | * | 1/1989 | Shimizu ............................ 361/813 |
| 4,805,113 | * | 2/1989 | Ishii et al. .................... 395/500.11 |
| 4,811,237 | * | 3/1989 | Putatunda et al. ............. 395/500.1 |
| 4,825,177 | * | 4/1989 | Teague et al. .................... 330/295 |
| 4,831,497 | * | 5/1989 | Webster et al. .................. 361/774 |
| 4,837,530 | * | 6/1989 | Kondoh .............................. 333/81 |
| 4,837,532 | * | 6/1989 | Lang ................................. 333/164 |
| 4,839,787 | * | 6/1989 | Kojima et al. ..................... 363/60 |
| 4,890,155 | * | 12/1989 | Miyagawa et al. ............... 174/250 |
| 4,899,162 | * | 2/1990 | Bayetto et al. ................... 343/700 |
| 4,965,739 | * | 10/1990 | Ng .............................. 395/500.13 |
| 4,965,863 | * | 10/1990 | Cray ................................. 326/116 |
| 4,983,910 | * | 1/1991 | Majidi-Ahy et al. ............. 324/754 |
| 5,003,253 | * | 3/1991 | Majidi-Ahy et al. ............. 324/754 |
| 5,010,588 | * | 4/1991 | Gimlett ............................. 359/189 |
| 5,014,018 | * | 5/1991 | Rodwell et al. ................... 333/20 |
| 5,021,743 | * | 6/1991 | Chu et al. ........................... 330/54 |
| 5,025,232 | * | 6/1991 | Pavio .................................. 333/26 |
| 5,050,091 | * | 9/1991 | Rubin .......................... 395/500.11 |
| 5,097,422 | * | 3/1992 | Corbin et al. ................ 395/500.09 |
| 5,119,314 | | 6/1992 | Hotta et al. . |
| 5,256,996 | * | 10/1993 | Marsland et al. ................. 333/220 |
| 5,352,994 | * | 10/1994 | Black et al. ........................ 333/33 |
| 5,588,141 | | 12/1996 | Smith et al. . |
| 5,745,894 | | 4/1998 | Burrows et al. . |
| 5,812,033 | * | 9/1998 | Chaki et al. ........................ 333/33 |

OTHER PUBLICATIONS

T.G. Matheson, C. Christensen and M.R. Buric, "A Software Environment for Building Core–Microcomputer Compilers," Proc. IEEE ICCD, Oct. 1985.

M.R. Buric and T.G. Matheson, "Silicon Compilation Environment," Proc. IEEE CICC, May 1985.

T.G. Matheson, "Development Tool Sets Lets Any Designer Build Silicon Compilers," Electronic Design, Jan. 9, 1986.

T.G. Matheson, "Capacitance Extraction, Notch and Gap Filling in Lc," Notes on Lscan in GDT, Silicon Design Labs, Nov. 22, 1987.

"GDT Database & Language Tools User Guide," Silicon COmpiler Systems, Version 3.0, Jun. 22, 1987.

"GDT—Generator Development Tools Software,Tutorial," Silicon Design Labs, Version 2.1, Apr. 15, 1986.

"GDT Database & Language Tools, Reference", Silicon Compiler Systems, Version 3.0, Jun. 22, 1987.

"GDT Generator Development tools Software Sample Generator", Silicon Compiler Systems Version 2.1, May 30, 1986.

Peter Odryna, "Simulator merges speed of logic verifiers with circuit–level accuracy," Electronic Design, Nov. 28, 1985.

Misha R. Burich, "Programming language makes silicon compilation a tailored affair," Electronic Design, Dec. 12, 1985.

Shao–Han Shou, "Silicon Compilation Aids IC Design," Defense Electronics, Sep. 1987, pp. 107–118.

P.A. Congdon, "Bipolar ($HI^2L$) Gate Arrays for Military Applications," 2nd Annual Probe Conference on GaAs, May 14–15, 1986.

Expert Report of Jeffrey Frey, for Civil Action No. 97–2030A, E.D.Va., May 26, 1998.

Expert Report of William vanCleemput, for Civil Action No. 97–2030A, E.D.Va., May 26, 1998.

Expert Report of Larry Richard Carley, for Civil Action No. 97–2030A, E.D.Va., May 4, 1998.

L. Claesen et al., Automatic Synthesis of Signal Processing Benchmarks using the CATHEDRAL Silicon Compiler, Proc. IEEE CICC, 1988.

T. Yoshimura and S. Goto, "A Rule–Based and Algorithmic Approach for Logic Synthesis," Proc. IEEE ICCAD, Nov. 1986.

C. Sechen and A. Sangiovanni–Vincentelli, "Timber-Wolf3.2: A New Standard Cell Placment and Global Routing Package," Proceedings of the Design Automation Conference, Jun. 1986.

G. Saucier and H. Hanriat, "Rule Based Logic Synthesis for Silicon Compilers," Proc. IEEE ICCAD, Nov. 1986.

J.A. Nestor and D.E. Thomas, "Behavioral Synthesis with Interfaces," Proc. IEEE ICCAD, Nov. 1986.

M. Kahrs, "Matching a Parts Library in a Silicon Compiler," Proc. IEEE ICCAD, Nov. 1986.

D.S. Harrison, P. Moore, R.L. Spickelmier, and A.R. Newton, "Data Management and Graphics Editing in the Berkeley Design Environment," Proc. IEEE ICCAD, Nov. 1986.

M. DeGrauwe et al., "IDAC: an interactive design tool for analog CMOS circuits," IEEE JSSC, vol. 22, No. 6, pp. 1106–1116, Dec. 1987.

M. DeGrauwe et al., "An Analog Expert Design System," IEEE ISSCC Digest of Technical Papers, pp. 212–213 & 406, Feb. 1987.

R.P. Sigg et al., "An SC Filter Compiler: Fully Automated Filter Synthesizer and Mask Generator for A CMOS Gate–Array–Type Filter Chip," Proc. IEEE ICCAD, Nov. 1987.

C.J. Abronson and W.H. Childs, "Workstations Provide an End–to–End Solution for Microwave Engineers," Microwave Systems News & Communications Technology, vol. 17, No. 9, pp. 8–19, Aug. 1987.

R.S. Carson, High Frequency Amplifiers, Wiley, New York, NY 1975.

A.A. Hopgood, Knowledge–Based Systems, Chapter 1, CRC Press, Boca Raton, FL, 1993.

D.G. Boyer, "Symbolic Layout Compaction Review," Proc. 25th Design Automation Conference, Jun. 1988.

R.W. Hunter, T.E. Furman, and D.E. Thomas, "Working Chips from High Level Synthesis: A Case Study from Industry," Proc. IEEE CICC, May 1984, pp. 144–147.

R. Harjani, R.A. Rutenbar, and L.R. Carley, "A Prototype Framework for Knowledge–Based Analog Circuit Synthesis," 24th ACM/IEEE Design Automation Conference, Miami Beach FL., pp. 42–49, Jun. 1987.

J. Rijmenants, T. Schwarz, J. Litsios, and R. Zinszer, "ILAC: An Automated Layout tool for Analog CMOS Circuits," Proc. IEEE CICC, May 1988.

P. Allen et al., "AIDE2: An Automated Analog IC Design System," Proc. IEEE CICC, May 1985.

H. Koh, C. Sequin, and P. Gray, "Automatic Synthesis of Operational Amplifiers Based on Analytical Circuit Models," Proc. IEEE ICCAD, pp. 502–505, Nov. 1987.

H. Yagutheil, A. Sangiovanni–Vincentalli, and P.R. Gray, "A Method for Automated Layout of Switched–Capacitor Filters," Proc. IEEE ICCAD, Nov. 1986.

B. Nye, A Sangiovanni–Vincentelli, J. Spoto and A. Tits, "DELIGHT.SPICE an Optimization–Based System for the Design of Integrated Circuits," Proc. IEEE ICCAD, Nov. 1983.

Expert Report of Sarta J. Sahni for Civil Action No. 97–2030A, E.D.VA; 1997.

Durand et al., "The 3D Visibility Complex: A Unified Data Structure For Global Visability of Scenes of Polygons and Smooth Objects"; 1997.

Excerpts from: D. Knuth, "Fundamental Algorithms: The Art of Computer Programming," vol. 1, Addison–Wesley, 1968.

Singleton and Crocker, "Practical automated design of LSI for large computers," Proc. 17th Design Automation COnference, 1980, pp. 556–559.

Martin et al., "CELTIC—Solving the problems of LSI design with an integrated polycell DA system," Proc. 18th Design Automation Conference, 1981, pp. 804–811.

Donze et al., "PHILO—A VLSI design system," Proc. 19th Design Automation Conference, 1982, pp. 163–169.

Smith et al., "A low cost, transportable, data management system for LSI/VLSI design," Proc. 19th Design Automation Conference, 1982, pp. 283–290.

Bennett, "A database management system for design engineers," Proc. 19th Design Automation Conference, 1982, pp. 28–273.

Odawara et al., "PAS–CIP: An interactive logic design system," Proc. 18th Design Automation Conference, 1981, pp. 443–449.

Roberts et al., "A vertically organized computer–aided design data base," Proc. 18th Design Automation COnference, 1981, pp. 595–601.

Korenjak and Teger, "An integrated CAD database system," Proc. 12th Design Automation Conference, 1975, pp. 399–406.

Ciampi and Nash, "Concepts in CAD data base structures," Proc. Design Automation Conference, 1976.

Expert Report of Carlo Sequin, for Civil Action No. 97–2030A, E.D.VA., Jul. 5, 1998.

Itkis et al. "Music—An Advanced Automated Mimic Design Methodology" (undated).

Sigg et al., "An SC Filter Complier Fully Automated Filters Synthesizer and Mask Generator for a CMOS Gate Array Type Filter Chip," 1987.

T.H.–Y. Meng et al., "Asynchronous Logic Synthesis for Signal Processing from High–Level Specifications," 1987.

Eby Friedman et al, "Parameterized Buffer Cells Integrated Into An Automated Layout System", IEEE 1985 Custom Integrated Circuits Conference.

Scott Powell et al, "A Parasitics Extraction Program For Closely–Spaced VLSI Interconnects", IEEE 1985 International Conference On Computer–Aided Design.

H.K.E. Liesenber and D.J. Kinniment, "An Autolayout System For A Hierarchical i.c. Design Environment", Integration, the VLSI Journal 1, 107–118, 1983, Elsevier Science Publishers B.V. (North–Holland).

Yoshishige Kitamura et al., A CMOS Macro Array, 1986 IEEE Int. Solid States Circuits Conference.

David E. Krekelberg, "A Custom Circuit Netlist Extractor With Detailed Parasistic Measurement and Mode Identification", 1984 IEEE Custom Integrated Circuits Conference.

A.J. Baden Fuller, "Computer Optimisation of Circuits Applied To The Modelling Of Microwave IC Passive Components", IEE Proceedings, vol. 133, Pt.H. No. 5, Oct. 1986.

R. Call and L. Silvestri, "Computer Layout Analysis For Parasitic MOS In Bipolar IC's", Proceedings of The $6^{th}$ International Conference On Custom and Semicustom ICs 4th–6th Nov. 1986—The Heathrow Penta Conference Centre–London, England.

Ping Yang et al, "Spice Modeling For Small Geometry MOSFET Circuits", IEEE Transactions on CAD Oct. 1982.

Touchstone/RF Product Summary, 1985.

EEsof MiCAD II Getting Started Manual, Oct. 1987.

NEC's Motion for Interpretation of the '111 Patent Claims for Civil Action No. 97–2030A, E.D.VA, Jul. 31, 1998.

Declaration of Michail Y. Itkis for Civil Action No. 97–2030A, E.D.VA, Jul. 30, 1998.

Excerpt from: Kernighan and Richie, The C Programming Language, Prentice–Hall, 1978 (Appendix 1 to Itkis's Declaration).

Object_t Struct Definition (Appendix 2 to Itkis's Declaration). (Undated).

Excerpts from Hayes–Roth, Waterman and Lenat, Building Expert Systems, 1983, Addison–Wesley (Appendix 3 to Itkis's Declaration).

Declaration of Joseph C. McAlexander for Civil Action No. 97–2030A, E.D.VA., Jul. 29, 1998.

Excerpt from Holt, Introduction to Electromagnetic Fields and Waves, John Wiley & Sons, 1966, p. 470 (Appendix 2 to McAlexander's Declaration).

Sample references on microwave frequency (Appendix 3 to McAlexander's Declaration). 1989, 1995, 1996.

Deposition Transcript of Chente Chao, Apr. 21–23, 1998, for Civil Action No. 97–2030A, E.D.VA.

Deposition Transcript of Noel F. Heal, Jul. 16, 1998, for Civil Action No. 97–2030A, E.D.VA.

Deposition Transcript of Michael Y. Itkis, for Civil Action No. 97–2030A, E.D.VA. Jun. 18, 1998.

TI's Motion For Interpretation Of Claim 1 of the U.S. Pat. No. 5,031,111 for Civil Action No. 2:98–CV00223; Nov. 1998.

Declaration of Thomas G. Matheson in Support of TI's Motion FOr Interpretation of Claim 1 of the U.S. Pat. No. 5,031,111 for Civil Action No. 2:98–CV–00223; Nov. 11, 1998.

EESoF's MICAD User's Manual Version 1.01, Sep., 1985.

HP 85200S/85201S, Personal Microwave Workstations CAE for Microwave Design New Product Training, 1987.

TRW Invention Disclosure for Automated Microwave Circuit Design Code, Mar. 17, 1988 (Exhibit 9 to Declaration of Thomas G. Matheson).

EESoF's Fables (vol. 1, No.2, Jun., 1985).

EESoF's Fables (vol. 1, No.3, Dec., 1985).

EESoF's Fables (vol. 2 No.1, Feb., 1986).

EESoF's Fables (vol. 2, No.2, Jun., 1986).

EESoF's Fables (vol. 2, No.3, Sep., 1986).

EESoF's Fables (vol. 3, No.2, Jun., 1987).

EESoF's Fables (vol. 3, No. 3, Nov. 1987).

EESoF's Fables (vol. 4, No.1, May, 1988).

EESoF's Fables Spotlighting Product Development, 1988.

EESoF's Fables "Libra" Signals New Advances in the Area of nonlinear Simulation, 1987.

EESoF Data Sheet, Touchstone Sr., 1986.

EESoF Data Sheet, FilterI: Edge–Coupled Stripline., Feb. 1986.

EESoF Data Sheet, Filter II: Edge–Coupled Microstrip, Feb., 1986.

EESoF Data Sheet, Microwave SPICE1.1, Oct., 1987.

EESoF Data Sheet Libra, Version 1.0, 1987.

EESoF Data Sheet E–Syn Version 2.0, 1987.

EESoF Data Sheet Touchstone/RF, Version 1.6 Feb. 1988.

EESoF Microwave SPICE, Feb., 1986.

EESoF Microwave filter Design Programs, 1986.

EESof Computer–aided engineering, design, and test software for the RF/microwave industry, 1986.

HP 9000, Series 300: A Multi–Tasking and Integrated CAE Environment, EESoF; (undated).

Apollo: A Multi–Tasking and Integrated CAE Environment, EESoF; (undated).

The DEC VAX Series: Shared Resource Capabilities in a Multi–User CAE Environment, EESoF; (undated).

EESoF, Touchstone Technical Summary, Jun., 1988.

EESoF, A Family of Computer–aided Engineering, Design, and Test Sofware for the Microwave/RF Industry, Nov., 1987.

EESoF A Pattern of Microwave/RF CAE Touchstone, 1985.

EESoF, Microwave computer–aided Design, MICAD, 1985.

EESoF, A Frequency–Domain Nonlinear Circuit Simulator Using the harmonic–Balance Method, Libra, Technical Summary, Nov., 1987.

EESoF, Application Note 9, Generalized Noise Analysis of a Distributed Amplifier with Touchstone 2.0, Jun., 1988.

EESof, Application Note 10, Design Centering/Yield Optimization of a balanced FEI Low Noise Amplifier June., 1988.

EESoF A Frequency–domain Nonlinear Circuit Simulator Using the Harmonic–Balance Method, Libra, Technical Summary, Nov., 1987.

EESoF Libra: A Technical Summary, Feb., 1988.

EESoF Users' Group News, vol. 1, No. 1, Apr., 1988.

* cited by examiner

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 7 are cancelled.

Claims 2, 3 and 6 are determined to be patentable as amended.

Claims 4, 5 and 8, dependent on an amended claim, are determined to be patentable.

New claims 9–37 are added and determined to be patentable.

2. A method for automatically designing an integrated circuit for operation at high frequencies, the method comprising:
  partitioning the circuit into target microcell modules;
  searching a library of microcell circuit designs for an exact match for each target microcell;
  for each microcell for which no exact match is found in the library, searching a sub-library of universal structured integrated circuit microcells, each of which has a fixed topology and an associated store of knowledge based data concerning the circuit's range of operation and limitations;
  upon finding an appropriate match in the sub-library, synthesizing the target microcell using the knowledge based [upon] *data* associated with the matching universal structured integrated circuit microcell;
  optimizing the target microcell;
  [producing a layout of the target microcell;]
  *determining at least one constraint wherein compliance with said at least one constraint avoids adverse effects on the electrical characteristics of the microcell;*
  *producing a layout of the target microcell comprising the steps of:*
    *considering at least one layout option said layout option comprising at least one placement option;*
    *determining whether said at least one layout option complies with said at least one constraint;*
    *if said layout option complies with said at least one constraint,*
      *performing said layout option;*
  compacting the target microcell to as small an area as possible [without adversely affecting the electrical characteristics of the microcell] *while complying with said at least one constraint*;
  simulating the target microcell to determine the effect of parasitic impedances, based on the knowledge based data associated with the universal structured integrated circuit microcell; and
  generating a coded output data stream in a suitable format to drive a conventional mask pattern generation machine.

3. A method as defined in claim 2, *wherein the circuit comprises at least one transmission line and* wherein the step of compacting includes:
  considering each *of said at least one* transmission line in the circuit in turn;
  initially setting a count of U-shaped bends in the transmission line to one;
  determining whether the line as bent in accordance with the current count still has sufficient length to meet its electrical requirements, and whether the line as bent will produce undesirable coupling between lines;
  depending on the results of the determining step, increasing the number of bends in the transmission line and repeating the determining step until such time as the determining step indicates that further compaction of the line is not possible;
  checking boundary conditions to ensure that the transmission line as bent is not unduly interfering with adjacent components; and
  terminating the compaction process.

6. A method for automatically compacting an integrated circuit having high-frequency transmission lines and intended for operation at frequencies up to millimeter-wave range, the method comprising;
  considering each transmission line in turn;
  *checking the aspect ratio, of length to width, of the transmission line;*
  *if the aspect ratio is below a predetermined threshold, terminating the compaction process;*
  *if the aspect ratio is not below said predetermined threshold,*
    initially setting a count of U-shaped bends in the transmission line to one;
    determining whether the line as bent in accordance with the current bend count still has sufficient length to meet its electrical requirements, and whether the line as bent will produce undesirable coupling between lines;
    depending on the results of the determining step, increasing the number of bends in the transmission line and repeating the determining step [will] *until* such time as the determining step indicates that further compaction of the line is not possible;
    checking boundary conditions to ensure that the transmission line as bent is not unduly interfering with adjacent components; and
    terminating the compaction process.

*9. A method as in claim 2 wherein said producing a layout step further comprises the step of:*
  *repeating said considering step, said determining step and said if step.*

*10. A method as in claim 2 wherein said at least one layout option comprises at least one orientation for a snake-like transmission line of said circuit layout.*

*11. A method as in claim 10 wherein said at least one orientation comprises one or more members of the group consiting of snake up, snake down, snake right and snake left.*

*12. A method as in claim 2 wherein said constraint comprises at least one boundary condition wherein compliance with said boundary condition avoids unduly interference with adjacent components.*

*13. A method as in claim 2 further comprising the preliminary step of inputting at least one design parameter.*

*14. A method as in claim 13 wherein said at least one design parameter comprises one or more members of the* group consisting of a lower frequency bound, a higher frequency bound, a desired noise figure and a desired gain.

15. A method as in claim 13 wherein said synthesizing step comprises the step of:
   determining initial values for at least one electrical characteristic of the target microcell from said at least one design parameter.

16. A method as in claim 13 wherein said synthesizing step comprises the step of:
   determining initial values for at least one physical characteristic of the target microcell from said at least one design parameter.

17. For use in a system for automatically fabricating integrated circuits for operation at high frequencies, an electronic design automation method comprising the steps of:
   a method for storing and retrieving data relating to circuit modules, comprising the steps of:
      partitioning a circuit into macrocells;
      partitioning the macrocells into microcells;
      partitioning the microcells into smaller microcells and primitive circuit elements;
      storing for each macrocell, microcell and primitive circuit element, data in a universal format, said data together defining electrical characteristics and interconnections, and physical characteristics and locations of the circuit modules, to form a complete hierarchical definition of the entire circuit, whereby circuit layout is facilitated because the electrical and physical characteristics are stored together in a unified data structure; and
   a method for generating said circuit layout of a circuit module comprising the steps of:
      inputting at least one design parameter;
      defining at least one contraint derived from said at least one design parameter wherein compliance with said at least one constraint by said circuit layout prevents one or more undesirable effects on the electrical performance of said circuit modules;
      considering at least one layout option;
      determining whether said at least one layout option complies with said at least one constraint;
      if said layout option complies with said at least one constraint, performing said layout option.

18. An electronic design automation method as in claim 17 wherein said method for generating said circuit layout further comprises compacting said circuit layout comprising the steps of:
   proposing at least one modification to said circuit layout;
   checking said proposed modification for compliance with said at least one constraint; and
   performing said proposed modification if said proposed modification complies with said at least one constraint.

19. An electronic design automation method as in claim 18 wherein said compacting said circuit layout step further comprises iterating on said proposing at least one modification step, said checking said proposed modification step and said performing said proposed modification step to compact said circuit layout to as small an area as possible without adversely affecting the electrical characteristics of the circuit module.

20. An electronic design automation method as in claim 18 wherein said constraint comprises at least one preselected threshold aspect ratio constraint.

21. A method for electronic design automation as in claim 18 wherein said constraint comprises at least one predetermined bend radius constraint.

22. A method for electronic design auutomation as in claim 18 wherein said constraint comprises at least one electrically required line length constraint.

23. A method for electronic design automation as in claim 18 wherein said constraint comprises at least one boundary condition.

24. A method for electronic design automation as in claim 18 wherein the circuit module comprises at least one transmission line and said at least one modification comprises changing said at least one transmission line.

25. A method for electronic design automation as in claim 24 wherein said at least one modification comprises creating at least one snake like transmission line.

26. A method for electronic design automation as in claim 25, wherein said at least one modification comprises changing an orientation of said at least one snake like transmission line.

27. A method for electronic design automation as in claim 24 wherein said at least one modification comprises performing at least one corner shift with said at least one transmission line.

28. A method for electronic design automation as in claim 24 wherein said at least one modification comprises creating at least one rectangular spiral with said at least one transmission line.

29. A method for electronic design automation as in claim 24 wherein said at least one modification comprises creating at least one quarter turn spiral with said at least one transmission line.

30. For use in a system for automatically fabricating integrated circuits for operation at high frequencies, an electronic design automation method comprising:
   a method for storing and retrieving data relating to circuit modules, comprising the steps of:
      partitioning a circuit into macrocells;
      partitioning the macrocells into microcells;
      partitioning the microcells into smaller microcells and primitive circuit elements;
      storing for each macrocell, microcell and primitive circuit element, data in a universal format, said data together defining electrical characteristics and interconnections, and physical characteristics and locations of the circuit modules, to form a complete hierarchical definition of the entire circuit, whereby circuit layout is facilitated because the electrical and physical characteristics are stored together in a unified data structure; and
   a layout checking method comprising the steps of:
      inputting at least one design parameter;
      determining at least one constraint derived from said at least one design parameter, said at least one constraint comprising at least one preselected threshold aspect ratio; and
      preventing the shape of one or more of said circuit modules or interconnections from having one or more undesirable effects on the electrical performance of said circuit, said preventing step comprising the step of checking said at least one constraint.

31. A method for storing and retrieving data relating to circuit modules as in claim 30 wherein said one or more undesirable effects include undesirable radiation effects.

32. A method for storing and retrieving data relating to circuit modules as in claim 30 wherein said one or more undersirable effects include undesirabel effects of radiation losses.

33. A method for storing and retrieving data relating to circuit modules as in claim 30 wherein said one or more undesirable effects include undesirable effects of scaling components in size.

34. For use in a system for automatically fabricating integrated circuits for operation at high frequencies, an electronic design automation method comprising:
a method for storing and retrieving data relating to circuit modules, comprising the steps of:
partitioning a circuit into macrocells;
partitioning the macrocells into microcells;
partitioning the microcells into smaller microcells and primitive circuit elements;
storing for each macrocell, microcell and primitive circuit element, data in a universal format, said data together defining electrical characteristics and interconnections, and physical characteristics and locations of the circuit modules, to form a complete hierarchical definition of the entire circuit, whereby circuit layout is facilitated because the electrical and physical characteristics are stored together in a unified data structure; and
a layout checking method comprising the step of preventing the shape of one or more of said circuit modules or interconnections from having one or more undersirable effects on the electrical performance of said circuit, said preventing step includes the step of checking at least one predetermined bend radius.

35. A method for storing and retrieving data relating to circuit modules as in claim 34 wherein said one or more undesirable effects include undesirable radiation effects.

36. A method for storing and retrieving data relating to circuit modules as in claim 34 wherein said one or more undesirable effects include undesirable effects of radiation losses.

37. A method for storing and retrieving data relating to circuit modules as in claim 34 wherein said one or more undesirable effects include undesirable effects of scaling components in size.

* * * * *